(12) United States Patent
Kuroda

(10) Patent No.: US 7,777,347 B2
(45) Date of Patent: Aug. 17, 2010

(54) SEMICONDUCTOR DEVICE

(75) Inventor: Hiroshi Kuroda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 252 days.

(21) Appl. No.: 11/756,941

(22) Filed: Jun. 1, 2007

(65) Prior Publication Data
US 2007/0278697 A1 Dec. 6, 2007

(30) Foreign Application Priority Data
Jun. 5, 2006 (JP) .............................. 2006-155658

(51) Int. Cl.
*H01L 23/52* (2006.01)
(52) U.S. Cl. ................. 257/777; 257/686; 257/723; 257/E21.511; 257/E21.505; 257/E25.013
(58) Field of Classification Search ................. 257/686, 257/723, 777, E21.511, E25.013, E21.505
See application file for complete search history.

(56) References Cited

U.S. PATENT DOCUMENTS

| 6,104,084 A * | 8/2000 | Ishio et al. ................... 257/666 |
| 7,119,426 B2 * | 10/2006 | Fukui et al. ................. 257/686 |
| 7,229,928 B2 * | 6/2007 | Baier .......................... 438/705 |
| 7,378,725 B2 * | 5/2008 | Sahaida et al. .............. 257/686 |
| 2003/0047813 A1 * | 3/2003 | Goller et al. ................. 257/777 |
| 2007/0001296 A1 * | 1/2007 | Lee et al. ..................... 257/723 |
| 2008/0280395 A1 * | 11/2008 | Sahaida et al. .............. 438/109 |

FOREIGN PATENT DOCUMENTS

JP     2005-322767     11/2005

* cited by examiner

*Primary Examiner*—Matthew E Warren
*Assistant Examiner*—David Spalla
(74) *Attorney, Agent, or Firm*—Mattingly & Malur, P.C.

(57) ABSTRACT

A first semiconductor chip, a spacer of plane shape, and a second semiconductor chip are put on a module substrate, sequentially. These semiconductor chips have a relation that every side of the first semiconductor chip is shorter than the first side and the second side of the second semiconductor chip, and longer than the third side and the fourth side of the second semiconductor chip. The border of the spacer is parallel to the third side and the fourth side and is placed inside the border of the first semiconductor chip. Even if the second electrode pad of the second semiconductor chip approaches the border of the first semiconductor chip, since a spacer secures space between the border portion of the first semiconductor chip and the second semiconductor chip, the wire combined with the second electrode pad does not contact the first semiconductor chip.

12 Claims, 10 Drawing Sheets

SEMICONDUCTOR DEVICE

CROSS-REFERENCE TO RELATED APPLICATION

The present application claims priority from Japanese patent application No. 2006-155658 filed on Jun. 5, 2006, the content of which is hereby incorporated by reference into this application.

BACKGROUND OF THE INVENTION

1. Field of the Invention

The present invention relates to a semiconductor device of the type "system in package" (SIP) having a stack structure in which a plurality of semiconductor chips are sealed into a module substrate.

2. Description of the Background Art

When a stack of a plurality of semiconductor chips are sealed into a module substrate, the electrode pad of a lower semiconductor chip overlaps with the upper semiconductor chip, and wire bonding cannot be performed, so it is possible to make a spacer intervene between the semiconductor chips to secure a space between them which lets a wire pass. In Japanese Unexamined Patent Publication No. 2005-322767, when the electrode pad of a lower semiconductor chip overlaps with the upper semiconductor chip, the spacer of both intermediate sizes is made to intervene between both sides, and a plurality of through holes or level differences are formed in the central part of the spacer according to the position of the electrode pad of a lower semiconductor chip. This enables the wire connected to the electrode pad of a lower semiconductor chip to be arranged without contacting the upper semiconductor chip. The main point of Japanese Unexamined Patent Publication No. 2005-322767 is to enable the wire connected to the electrode pad of a lower semiconductor chip which overlaps with the upper semiconductor chip to be arranged without contacting the upper semiconductor chip.

SUMMARY OF THE INVENTION

In the system in package (SIP) of stack structure, when a lower semiconductor chip is smaller than the size of the upper semiconductor chip, there is a method of forming a through hole along each side of a spacer (along the electrode pad row of a lower semiconductor chip) so that the wire connected to the electrode pad of a lower semiconductor chip does not contact the spacer for laminating the upper semiconductor chip. In this case, the peripheral part (portion outside a through hole) of a spacer is supported at no more than two places. When wire bonding is done to the electrode pad of the upper semiconductor chip by this, even if the peripheral part of the spacer is arranged to near the bottom of the portion in which the electrode pad of the upper semiconductor chip is formed, since the supporting strength of the peripheral part of a spacer is low, it is difficult to improve the rigidity of the upper semiconductor chip. Hereby, the load of a capillary cannot be borne, but the peripheral part of the upper semiconductor chip bends and variation generates in the bond strength in each electrode pad. It may not bear out against the load of a capillary; but a chip crack may occur. When the support has been arranged in the four corners, the flow of sealing resin is hampered in a sealing body forming step, and a void may occur on the reverse side (between a semiconductor chip and supports) of a support. Structure will be complicated and a manufacturing cost will increase.

A purpose of the present invention is in offering the semiconductor device which can simplify the structure of the spacer for bonding being possible with a wire and for providing a stack of semiconductor chips with which both chip size and the alignment of an electrode pad differ in varying embodiments and which can aim at cost reduction.

The above-described and the other purposes and novel features of the present invention will become apparent from the description herein and accompanying drawings.

Of the inventions disclosed in the present application, typical ones will next be summarized briefly.

A semiconductor device (MDL) concerning this present invention comprises at least a first semiconductor chip (4), a spacer (3) of plane shape as a whole, and a second semiconductor chip (2) which were laid over a module substrate (5) sequentially from first to second. Border portions of a first side (220) and a second side (221) which are on opposite two sides of the second semiconductor chip seen from superposition are located inside a border portion of the first semiconductor chip, and border portions of a third side (200) and a fourth side (202) which are set perpendicular to the first two sides two sides of the second semiconductor chip are projected outside a border portion of the first semiconductor chip. A border portion of the spacer parallel to the third side and the fourth side of the second semiconductor chip is located inside a border portion of the first semiconductor chip seen from superposition. The first semiconductor chip has a first electrode pad (401, 403, 405, 407) in an edge part. The second semiconductor chip has a second electrode pad (201, 203) along the third side and the fourth side. The module substrate has a first bonding lead (501, 504, 506, 509) connected to the first electrode pad with a wire (410, 411, 412, 413), and a second bonding lead (502A, 507A) connected to the second electrode pad with a wire (210, 211).

As one embodiment of the present invention, all the peripheral edge parts of the spacer seen from superposition are located inside the peripheral edge part of the first semiconductor chip. Minimization and cost reduction of a spacer are promoted.

As another embodiment of the present invention, the edge of the spacer is jutted out of the edge of the first side and the second side of the second semiconductor chip outside. It is for coping with the case where the third side and the fourth side of the second semiconductor chip are comparatively short to the side of the first semiconductor chip.

When the thickness dimension of the first semiconductor chip is set to A and the overhang length of the border portion of the first semiconductor chip to the border of the spacer is set to B as another embodiment of the present invention, B/A is ten or less. It becomes a standard in the case of all using a plane shape spacer.

As another embodiment of the present invention, the spacer is a silicon chip. Since increasing the number of the spacers which can be gained from one wafer leads to the cost reduction directly in using a silicon chip for a spacer, the miniaturization of a spacer is useful for the cost reduction of a semiconductor device directly.

As another embodiment of the present invention, the semiconductor device further comprises a third semiconductor chip (1) piled up under the second semiconductor chip over the module substrate. As for the third semiconductor chip, all peripheral edge parts are jutted out of an peripheral edge part of the second semiconductor chip outside. The third semiconductor chip has a third electrode pad (101, 103) at a fifth side (100) and a sixth side (102) which are one opposite two sides which went along each side of the third side and the fourth side of the second semiconductor chip, and each side of the fifth side and the sixth side of the third semiconductor chip is made longer than each side of a seventh side (120) and an eighth side (121) which is the other opposite two sides of the third semiconductor chip. The module substrate has a third bonding lead (502B, 507B) connected to the third electrode pad with a wire (110, 111). Distance spaced out from a border of the module substrate is at an order of the third bonding lead, the second bonding lead, and the first bonding lead.

According to this, the fifth side and the sixth side of the relatively longer side where the third electrode pad of the third semiconductor chip was arranged in parallel have been arranged in parallel to the third side and the fourth side where the both sides of the first electrode pad and the second electrode pad were arranged in parallel. Therefore, it is easy to enlarge the space from the fifth side and the sixth side of the third semiconductor chip to the corresponding edge of a module substrate compared with the space from the seventh side and the eighth side of the third semiconductor chip to the corresponding edge of a module substrate. The first through third electrode pad faces the space of the big side. The first electrode pad faces the space of the smaller side. Since many bonding leads can be arranged to a big space, it becomes easy to arrange the bonding lead which connects each electrode pad with a wire to a module substrate.

A semiconductor device by another viewpoint of the present invention comprises a first semiconductor chip (4), a spacer (3) of plane shape as a whole, a second semiconductor chip (2), and a third semiconductor chip (1) which were laid over a module substrate (5) sequentially from upper part. The first semiconductor chip has a plurality of first electrode pads (401, 403, 405, 407) in all peripheral edge parts. The second semiconductor chip has a plurality of second electrode pads (201, 203) into a border portion of first opposite two sides (200, 202). The third semiconductor chip has a plurality of third electrode pads (101, 103) into a border portion of second opposite two sides (100, 102) parallel to the first opposite two sides. The module substrate has a plurality of first bonding leads (501, 504, 506, 509) arranged along a periphery of the module substrate, a plurality of second bonding leads (502A, 507A) arranged along the second electrode pad in an inside of the module substrate rather than the first bonding lead, and a third bonding lead (502B, 507B) arranged along the third electrode pad in an inside of the module substrate rather than the second bonding lead. All peripheral edge parts of the spacer seen from superposition are located inside a peripheral edge part of the first semiconductor chip. A border portion of first opposite two sides of the second semiconductor chip seen from superposition is located inside a border portion of the first semiconductor chip, and a border portion of second opposite two sides of the second semiconductor chip is projected outside a border portion of the first semiconductor chip. As for the third semiconductor chip seen from superposition, all peripheral edge parts jut out of a peripheral edge part of the second semiconductor chip outside. The semiconductor device has a first wire (410, 411, 412, 413) which connects the first electrode pad to a corresponding first bonding lead, a second wire (210, 211) which connects the second electrode pad to a corresponding second bonding lead, and a third wire (110, 111) which connects the third electrode pad to a corresponding third bonding lead.

According to this, the situation where the wire which combines the second electrode pad with the second bonding lead contacts the first semiconductor chip undesirably can be done avoidable like the above. The arranging relation concerned of the first semiconductor chip and the second semiconductor chip guarantees making the spacer into plane shape on the whole, and does not reach for forming a through hole and a support on the way, but contributes to cost reduction. So, overall rigidity of a spacer can be enlarged.

As one embodiment of the present invention, the third semiconductor chip is fixed with adhesion paste to the module substrate, the second semiconductor chip is fixed with adhesion paste to the third semiconductor chip, the spacer is fixed with an adhesive film to the second semiconductor chip, and the first semiconductor chip is fixed with an adhesive film to the spacer. When a spacer is fixed on the second semiconductor integrated circuit, a possibility that adhesion paste may fall on the front surface of the second bonding pad can be prevented beforehand. When the first semiconductor chip is fixed on a spacer, a possibility that adhesion paste may fall on the front surface of the second bonding pad can be prevented beforehand.

As one embodiment of the present invention, the first semiconductor chip is a microcomputer chip, the second semiconductor chip is a nonvolatile memory chip, and the third semiconductor chip is a volatile memory chip. Let these semiconductor chips be examples that a difference of chip size and electrode pad arrangement living-izes.

Advantages achieved by some of the most typical aspects of the invention disclosed in the present application will be briefly described below.

That is, the structure of the spacer for making possible the stack of the bonding of a plurality of semiconductor chips from which chip size and the arrangement form of an electrode pad differ with a wire, respectively can be simplified, and cost reduction can be aimed at.

DETAILED DESCRIPTION OF THE PREFERRED EMBODIMENTS

Figure 1:
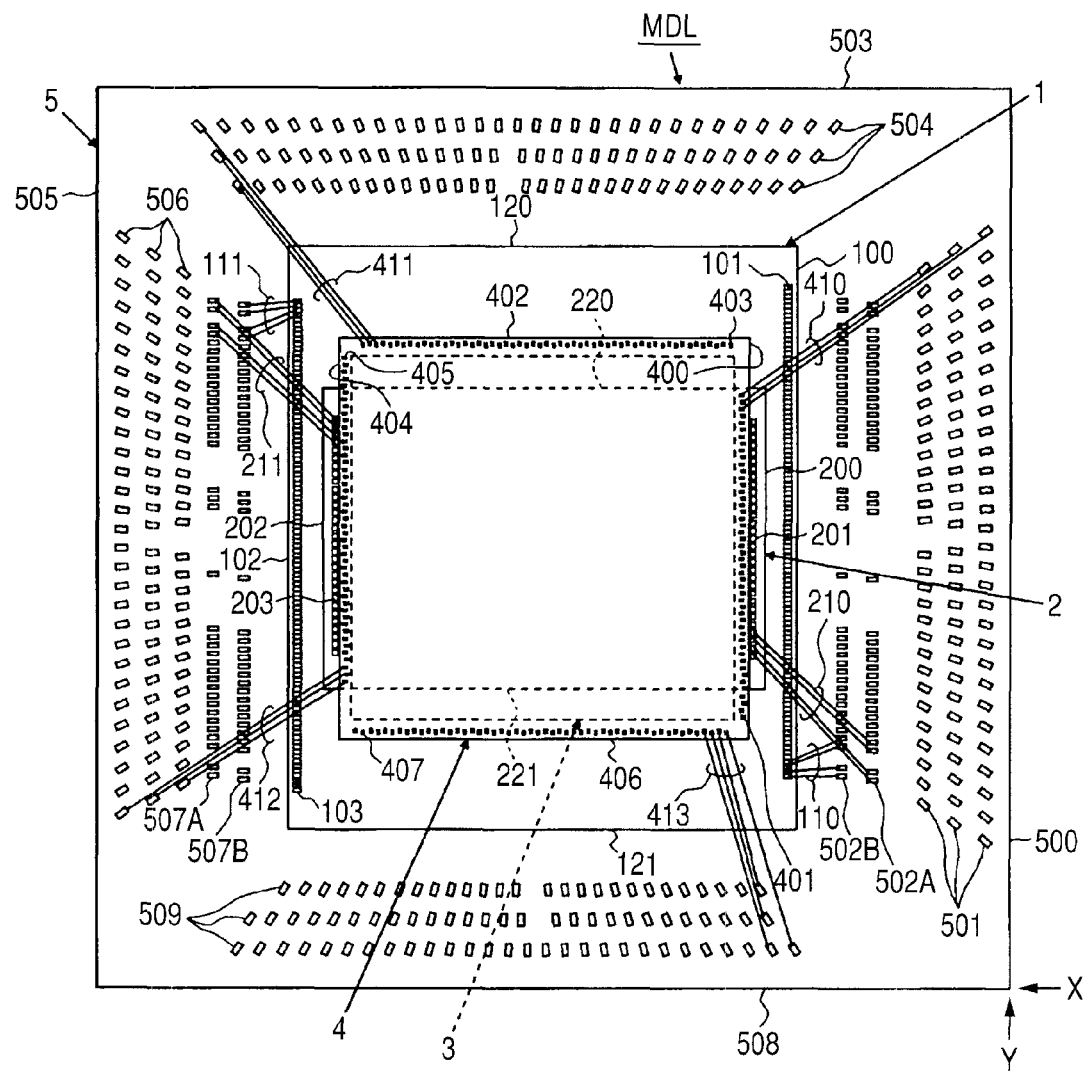
FIG. 1 is a plan view showing an example of the semiconductor device concerning the present invention in plan view.

An example of the semiconductor device concerning the present invention is shown in FIG. 1 in plan view. The section structure seen from the x direction in FIG. 1 is roughly shown in FIG. 2, and the section structure seen from the y direction in FIG. 1 is roughly shown in FIG. 3.

Semiconductor device MDL shown in the same drawing has the SIP structure formed by doing the stack of semiconductor chip (third semiconductor chip) 1, semiconductor chip (second semiconductor chip) 2, spacer 3, and the semiconductor chip (first semiconductor chip) 4 to module substrate (wiring substrate) 5 one by one. Although not restricted in particular, semiconductor chip 1 is set as the SDRAM chip as a volatile memory chip, semiconductor chip 2 is made into the flash memory chip as a nonvolatile memory chip, and semiconductor chip 4 is used as a microcomputer chip, and let spacer 3 be a silicon chip. Hereafter, semiconductor chip 1 is also called SDRAM chip 1, semiconductor chip 2 is also called flash memory chip 2, and semiconductor chip 4 is also called microcomputer chip 4. The SDRAM chip 1, flash memory chip 2, and microcomputer chip 4 use CMOS integrated circuit manufacturing technology etc. to a silicon substrate, respectively, and are formed. Although not restricted in particular, microcomputer chip 4 is a custom-made article, and flash memory chip 2 and SDRAM chip 1 are the general-purpose articles based on JEDEC (Joint Electron Device Engineering Council) etc.

Microcomputer chip 4 has CPU (central processing unit), ROM (read only memory) which stored programs, such as OS (operating system) of CPU, static RAM (random access memory) which is used for the work region of CPU, peripheral circuits, such as an external bus interface controller, a memory controller, and a timer, an external I/O port, etc. which were formed in the semiconductor region on the silicon substrate, respectively. Flash memory chip 2 has the memory cell array which was formed in the semiconductor region on the silicon substrate, respectively and to which matrix arrangement of the nonvolatile memory cell of a large number which can electrically rewrite was done. An address and a command are inputted from the outside, and rewriting and read-out of memory information to a nonvolatile memory cell are performed responding a command, for example, it has a storage capacity of 256 megabits. SDRAM chip 1 has the memory cell array which was formed in the semiconductor region on the silicon substrate, respectively and to which matrix arrangement of many dynamic type memory cells was done. A clock, an address, and a command are inputted from the outside, and writing and read-out operation which responds a command is performed synchronizing with a clock, for example, it has a storage capacity of 512 megabits.

Microcomputer chip 4 has the plate shape of the size of x4×y4 of almost square, and has electrode pad 401 of a single tier which went along side 400, has electrode pad 403 of a single tier which went along side 402, has electrode pad 405 of a single tier which went along side 404, and has electrode pad 407 of a single tier which went along side 406 in the edge part as a first electrode pad. The electrode pads 401, 403, 405, and 407 are connected to the circuit formed in the semiconductor region on the silicon substrate of microcomputer chip 4 via a wiring layer.

Spacer 3 has the plate shape of the size of x3×y3 of almost square, for example, is formed by the silicon chip.

Flash memory chip 2 has the plate shape of the size of x2×y2 of almost rectangular, and has electrode pad 201 of a single tier which went along side 200 (third side) of the shorter side, and, similarly has electrode pad 203 of a single tier which went along side 202 (fourth side) of the shorter side in the border part as a second electrode pad. The electrode pad is not arranged on the border of side 220 (first side) and 221 (second side) of a longish side. The electrode pads 201 and 203 are connected to the circuit formed in the semiconductor region on the silicon substrate of flash memory chip 2 via a wiring layer.

SDRAM chip 1 has the plate shape of the size of x1×y1 of almost rectangular, and has electrode pad 101 of a single tier which went along side 100 (fifth side) of the longish side, and, similarly has electrode pad 103 of a single tier which went along side 102 (sixth side) of the longish side in the border part as a third electrode pad. The electrode pad is not arranged on the border of side 120 (seventh side) and 121 (eighth side) of the shorter side. The electrode pads 101 and 103 are connected to the circuit formed in the semiconductor region on the silicon substrate of SDRAM chip 1 via a wiring layer.

Module substrate 5 is formed by the rectangular wiring substrate made of glass epoxy resin which has a wiring layer, for example, and many ball electrodes 511 are arranged in the shape of an array in a back surface. In the front surface of module substrate 5, as a first bonding lead corresponding to the first electrode pad (401, 403, 405, 407), it has bonding lead 501 arranged in three rows from the outside along side 500, bonding lead 504 arranged in three rows from the outside along side 503, bonding lead 506 arranged in three rows from the outside along side 505, and bonding lead 509 arranged in three rows from the outside along side 508. In the front surface of module substrate 5, as a second bonding lead corresponding to the second electrode pad (201, 203) further, it has bonding lead 502A arranged in one row along side 500 inside the bonding lead 501, and has bonding lead 507A arranged in one row along side 505 inside the bonding lead 506. Module substrate 5, as a third bonding lead corresponding to the third electrode pad (101, 103), has bonding lead 502B arranged in one row along side 500 inside the bonding lead 502A, and has bonding lead 507B arranged in one row along side 505 inside the bonding lead 507A.

Electrode pads 401, 403, 405, and 407 of the microcomputer chip 4 are combined with bonding leads 501, 504, 506, and 509 by bonding wires 410, 411, 412, and 413. Electrode pads 201 and 203 of flash memory chip 2 are combined with bonding leads 502A and 507A by bonding wires 210 and 211. Electrode pads 101 and 103 of SDRAM chip 1 are combined with bonding leads 502B and 507B by bonding wires 110 and 111. Although illustration in particular is not done, each bonding leads 501, 504, 506, 509, 502A, 502B, 507A, and 507B are connected to the corresponding ball electrode 511 via the through hole or the wiring. The whole front surface of module substrate 5, microcomputer chip 4, spacer 3, flash memory 2, SDRAM 1, and a plurality of bonding wires (410, 411, 412, 413, 210, 211, 110, 111) are protected by sealing resin 6.

The size, and a pile state of the chips 1, 2, and 4 and spacer 3 are explained. The chip size of microcomputer chip 4 and flash memory chip 2 has a relation of x4>x2, y2>y4, y2>x4, and y4>x2. A part of sides 220 and 221 of flash memory chip 2 (except for the neighborhood of both ends) hides (is located) under microcomputer chip 4. Sides 200 and 202 of flash memory chip 2 are out of sides 400 and 404 of microcomputer chip 4. Here, let protruding quantity of the border portion which went along sides 200 and 202 of flash memory chip 2 be a degree that bonding electrodes 201 and 203 expose barely out of microcomputer chip 4.

Regarding spacer 3, it has a relation of x4>x3 and y4>y3, and each side (peripheral part) of spacer 3 is hidden (is located) under microcomputer chip 4. When it explains further, regarding each relation to the long side (402,406) of microcomputer chip 4, and the long side (220,221) of flash memory chip 2, since its difference in dimension is large like x2<<x4, spacer 3 is made into a size which has a relation of x4>x3>x2 and y2>y4>y3.

Figure 17:
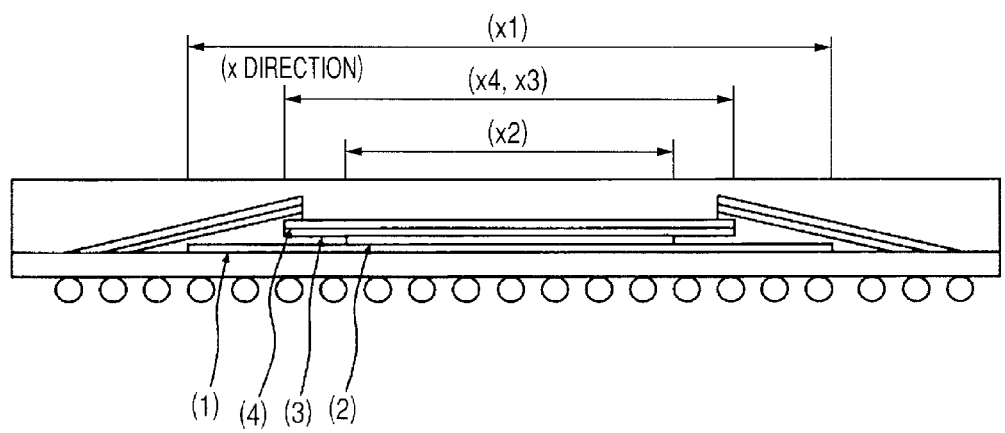
FIG. 17 is the first comparative examination picture showing roughly the section structure seen from the x direction.
Figure 18:
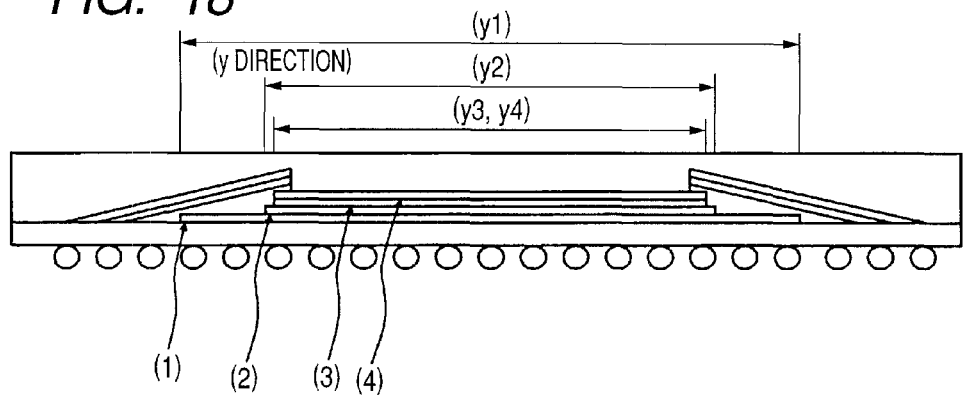
FIG. 18 is the first comparative examination picture showing roughly the section structure seen from the y direction.

As shown in the comparative examination picture of FIG. 17 and FIG. 18, for example, when the form of spacer 3 of this is the same as that of the size of microcomputer chip 4 (at the time of x3=x4), as for the relation between the long side of microcomputer chip 4, and the long side of flash memory chip 2, even if its difference in dimension is large like x2<<x4 like the stack structure of this embodiment, since spacer 3 is located in the electrode pad (401,403,405,407) lower part arranged along each side of a microcomputer chip, the rigidity of microcomputer chip 4 improves. Since microcomputer chip 4 becomes difficult to bend by this even if the load of a capillary is applied to the electrode pad (401,403,405,407) of microcomputer chip 4 in a wire-bonding step, the bond strength in each electrode pad (401,403,405,407) becomes difficult to vary. However, since spacer 3 is needed by the part of the size of microcomputer chip 4, material cost will increase. Since the border of microcomputer chip 4 is located in the short side (200,202) side of flash memory chip 2 to the position which overlaps with the electrode pad (201,203) of flash memory chip 2 in plan view mostly, when spacer 3 has a relation of y4=y3, a part of capillary will contact the border of microcomputer chip 4, and it will become difficult to perform wire bonding in the electrode pad at the side of the short side of flash memory chip.

Figure 19:
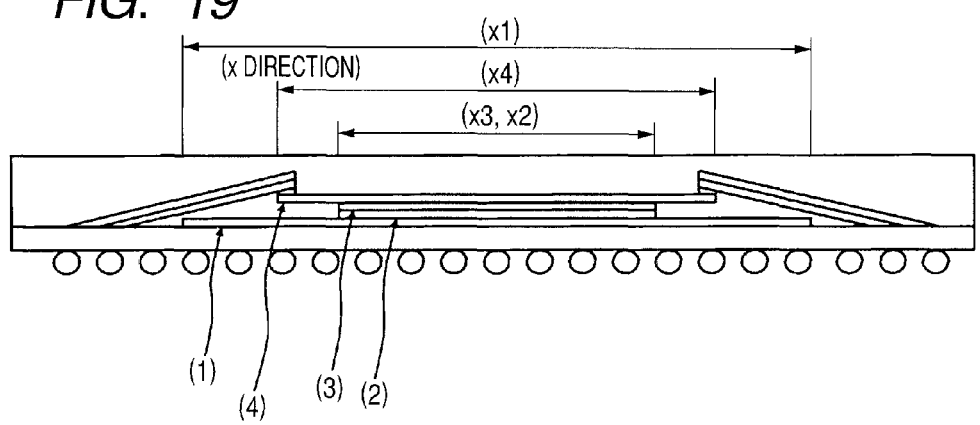
FIG. 19 is the second comparative examination picture showing roughly the section structure seen from the x direction.
Figure 20:
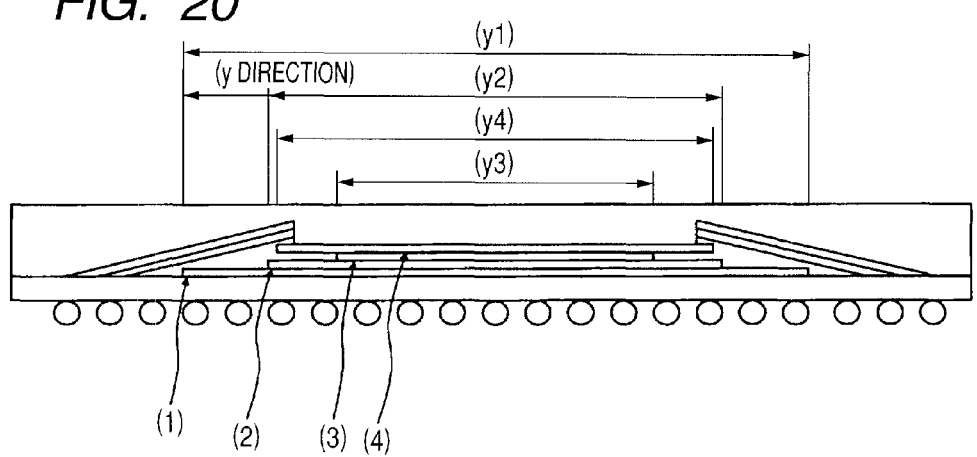
FIG. 20 is the second comparative examination picture showing roughly the section structure seen from the y direction.

As shown in the comparative examination picture of FIG. 19 and FIG. 20, when the form of spacer 3 is smaller than the size of microcomputer chip 4, and is the same as the long side (220,221) of flash memory chip 2, for example, and has the size that the border of spacer 3 comes inside sufficiently rather than the position in which the electrode pad (201,203) was formed of flash memory chip 2 (at the time of x4>x3=x2 and y2>y4>y3), the problem of the wire bonding defect in the electrode pad (201,203) at the side of the short side (200,202) of flash memory chip 2 is solvable. The size of spacer 3 was made smaller than the case where it is shown in FIG. 17, and material cost can be reduced. However, since spacer 3 is not located in the electrode pad (401,403,405,407) lower part arranged along each side of microcomputer chip 4, the rigidity of microcomputer chip 4 cannot be improved. By this when the load of a capillary is applied to the electrode pad (401,403,405,407) of microcomputer chip 4 in a wire-bonding step, since microcomputer chip 4 bends easily, bond strength varies in each electrode pad (401,403,405,407).

As a result of a present application inventor's examining the above problems, when piling up chips 4 and 2 which have a relation that each side (400,402,404,406) of microcomputer chip 4 is shorter than sides 200 and 202 of flash memory chip 2 and is longer than sides 220 and 221 of flash memory chip 2, by doing the border of spacer 3 parallel to sides 200 and 202 of flash memory chip 2 inside the border of microcomputer chip 4, even if electrode pads 201 and 203 of flash memory chip 2 are close to the border of microcomputer chip 4, space is secured to the portion between the border portion of microcomputer chip 4, and flash memory chip 2 by spacer 3. By this space, the situation of wires 210 and 211 which combine electrode pads 201 and 203 with bonding leads 502A and 507A contacting microcomputer chip 4 undesirably can be made avoidable. The arranging relation concerned of microcomputer chip 4 and flash memory chip 2 guarantees making the spacer 3 plane shape as a whole, and does not reach for forming a through hole and a support on the way, but contributes to cost reduction in respect of the working manhour of spacer 3. So, overall rigidity of spacer 3 can be enlarged. When doing bonding of the wires 410, 411, 412, and 413 to electrode pads 401, 403, 405, and 407 of microcomputer chip 4, the wire concerned must be pushed and pressed to electrode pads 401, 403, 405, and 407, heating ultrasonically. So, the deflection by a cantilever in the border portion of microcomputer chip 4 becomes large, and will generate variation in bond strength according as the retreat distance of the border portion of spacer 3 to the border of microcomputer chip 4 becomes long. However, since high rigidity is in spacer 3 itself as mentioned above, bending by a cantilever can be suppressed. Bonding performance is equalized at this point. It becomes possible to enlarge the withdrawal size of the spacer 3 edge to the border portion of microcomputer chip 4. A miniaturization and cost reduction of spacer 3 are realizable. Since increasing the number of the spacers which can be gained from one wafer leads to the cost reduction directly in using a silicon chip for a spacer, the miniaturization of a spacer is useful for the cost redaction of direct semiconductor device MDL.

All the peripheral edge parts of the spacer 3 seen from superposition are located inside the peripheral edge part of microcomputer chip 4. Minimization and cost reduction of spacer 3 can be promoted. The edge of the spacer 3 is jutted out of sides 220 and 221 of the flash memory chip 2 outside. This is for securing the bond strength to electrode pads 403 and 407, when sides 220 and 221 of flash memory chip 2 are comparatively short to sides 402 and 406 of microcomputer chip 4.

Figure 2:
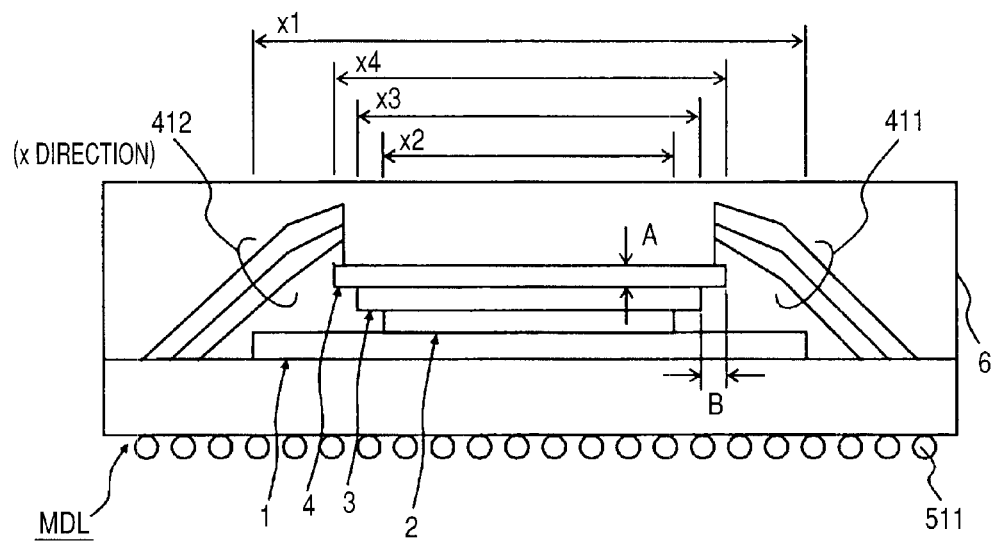
FIG. 2 is an explanatory diagram showing roughly the section structure seen from they direction in FIG. 1.
Figure 3:
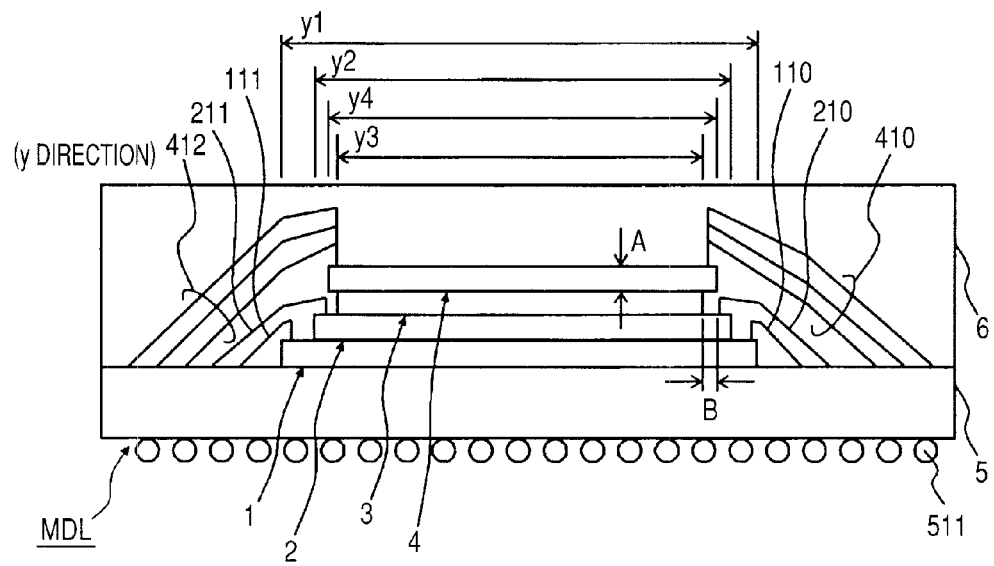
FIG. 3 is an explanatory diagram showing roughly the section structure seen from the y direction in FIG. 1.

When silicon chip spacer 3 of plate shape as a whole is used, for the bonding lead by which bonding was done obtaining the necessary bond strength which is not undesirably separated by an assembly process, when the thickness dimension of microcomputer chip 4 is set to A and the overhang length of the border portion of microcomputer chip 4 to the border of the spacer 3 is set to B, as shown in FIG. 2 and FIG. 3, it was shown clearly that what is necessary was just to make B/A ten or less. Hereby, spacer 3 by which the relation between the size of microcomputer chip 4 and the size of spacer 3 will satisfy that B/A is ten or less, in other words satisfy the relation of x4>x3>x2 in a x direction is used in this embodiment.

Sides 100 and 102 of the relatively longer side where electrode pads 101 and 103 of the SDRAM chip were arranged in parallel are arranged in parallel with sides 200 and 202 where the both sides of electrode pads 201 and 203 of flash memory chip 2 and electrode pads 401 and 405 of microcomputer chip 4 were arranged in parallel. Therefore, it is easy to enlarge the space from sides 100 and 102 of SDRAM chip 1 to borders 500 and 505 of a module substrate compared with the space from sides 120 and 121 of SDRAM chip 1 to borders 503 and 508 of a module substrate. Electrode pads 101, 201, and 401 (103, 203, 405) of three rows face the space of the big side, respectively. Electrode pad 403 (407) of one row faces the space of the smaller side, respectively. Since many bonding leads can be arranged to a big space, it becomes easy to arrange the bonding lead which connects each electrode pad with a wire to module substrate 5.

Figure 4:
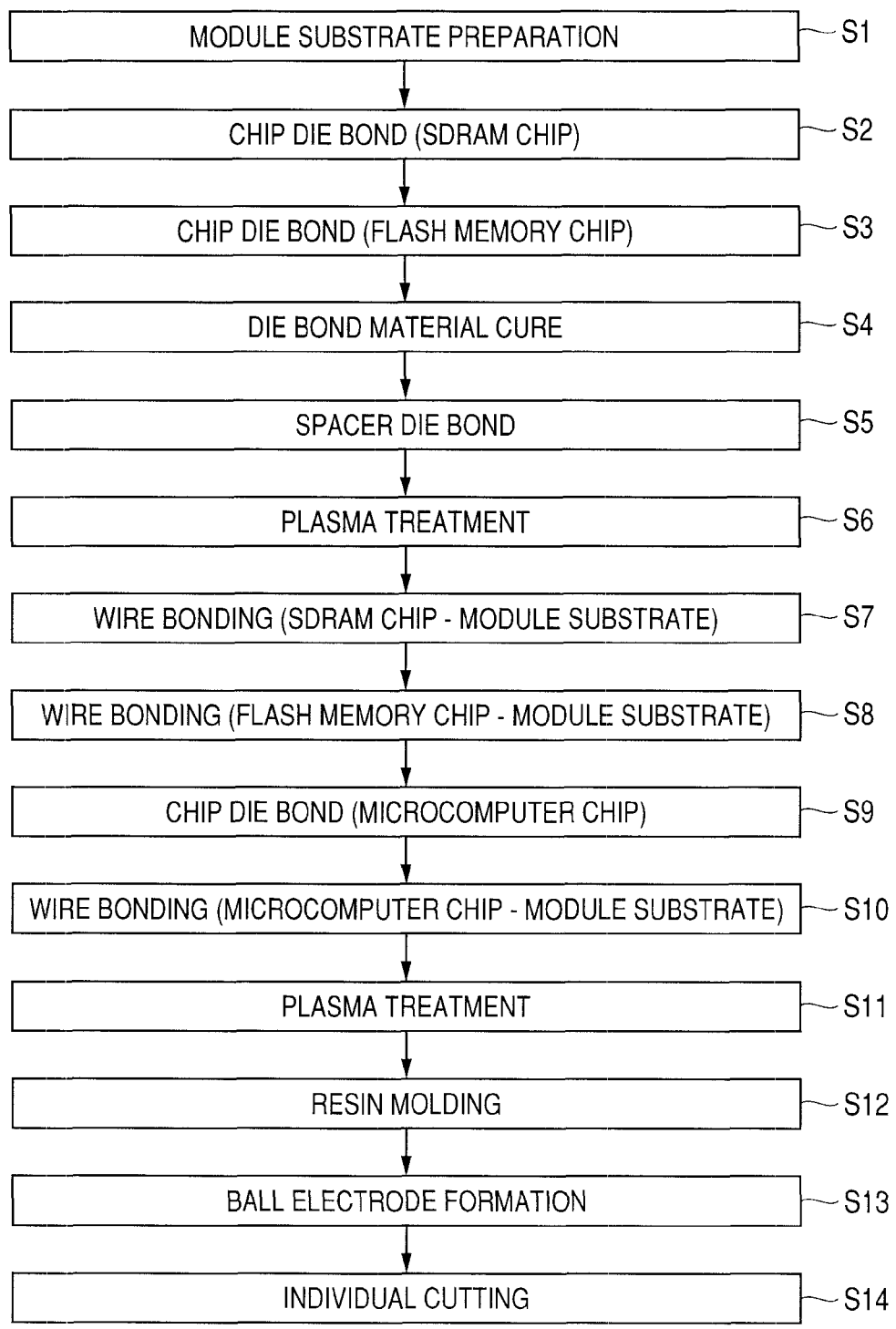
FIG. 4 is a flow chart which shows the manufacturing process of the semiconductor device of the present invention.
Figure 5:
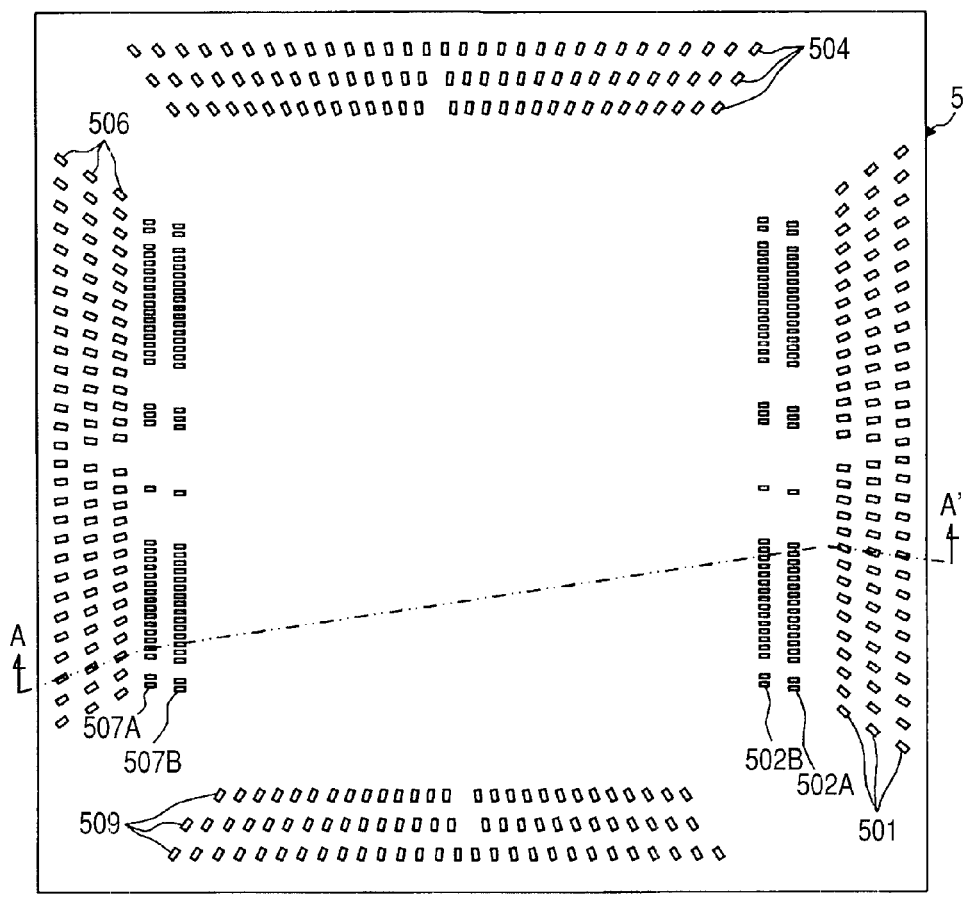
FIG. 5 is a schematic plan view of a module substrate.
Figure 6:
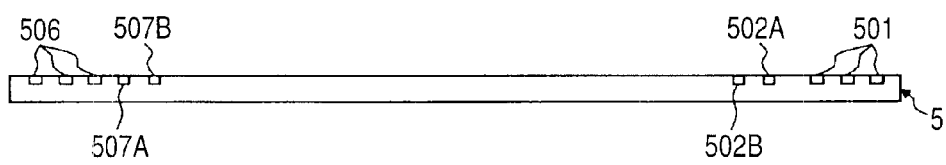
FIG. 6 is a schematic cross-sectional view which goes along the A-A' line of FIG. 5.

Next, it explains along the flow chart shown in FIG. 4 about the manufacturing method of semiconductor device MDL4. First, at Step S1 of FIG. 4, module substrate 5 shown in FIG. 5 and FIG. 6 is prepared. As for module substrate 5, the plurality of bonding leads 501, 502A, 502B, 504, 506, 507A, 507B, and 509 are formed along a plurality of sides on the front surface (main surface), respectively.

Figure 7:
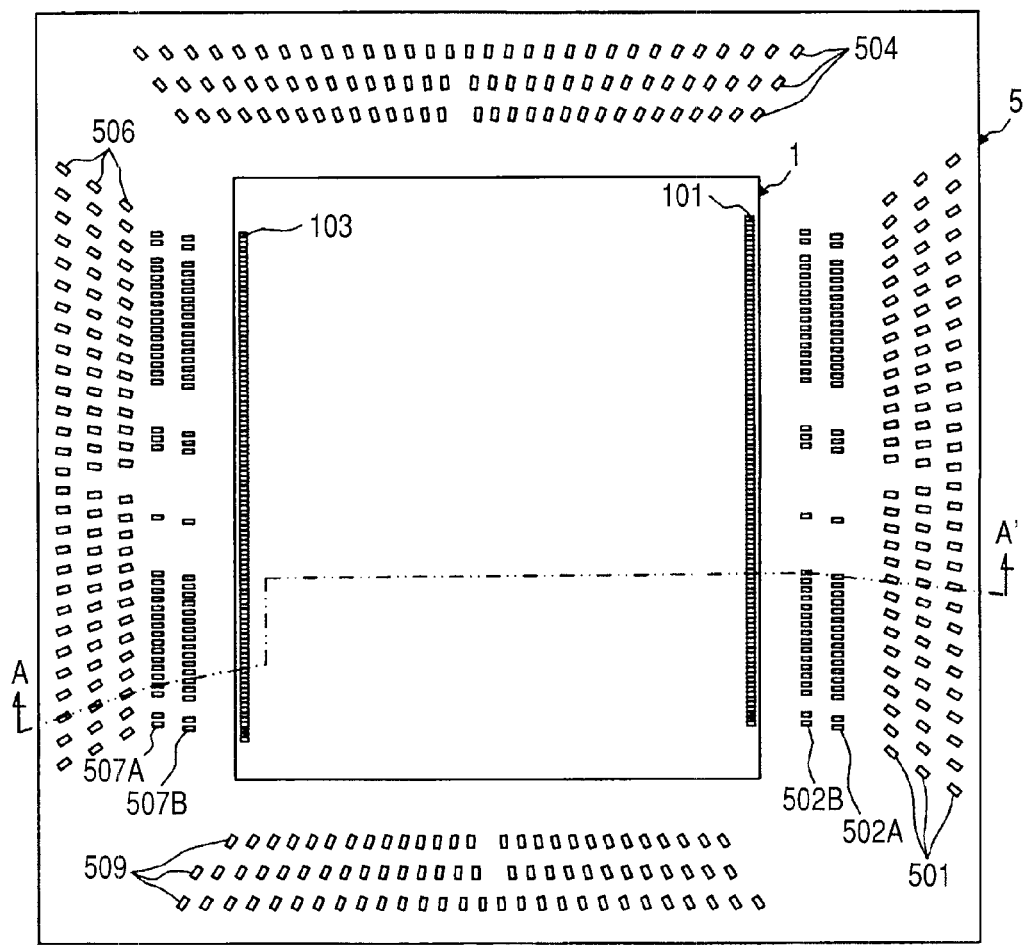
FIG. 7 is the schematic plan view which mounted the SDRAM chip on the module substrate.
Figure 8:
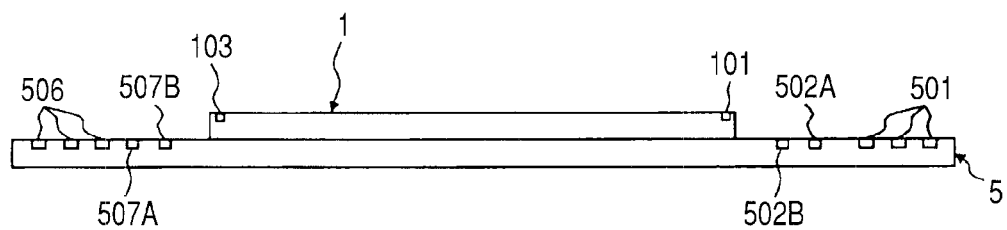
FIG. 8 is a schematic cross-sectional view which goes along the A-A' line of FIG. 7.
Figure 9:
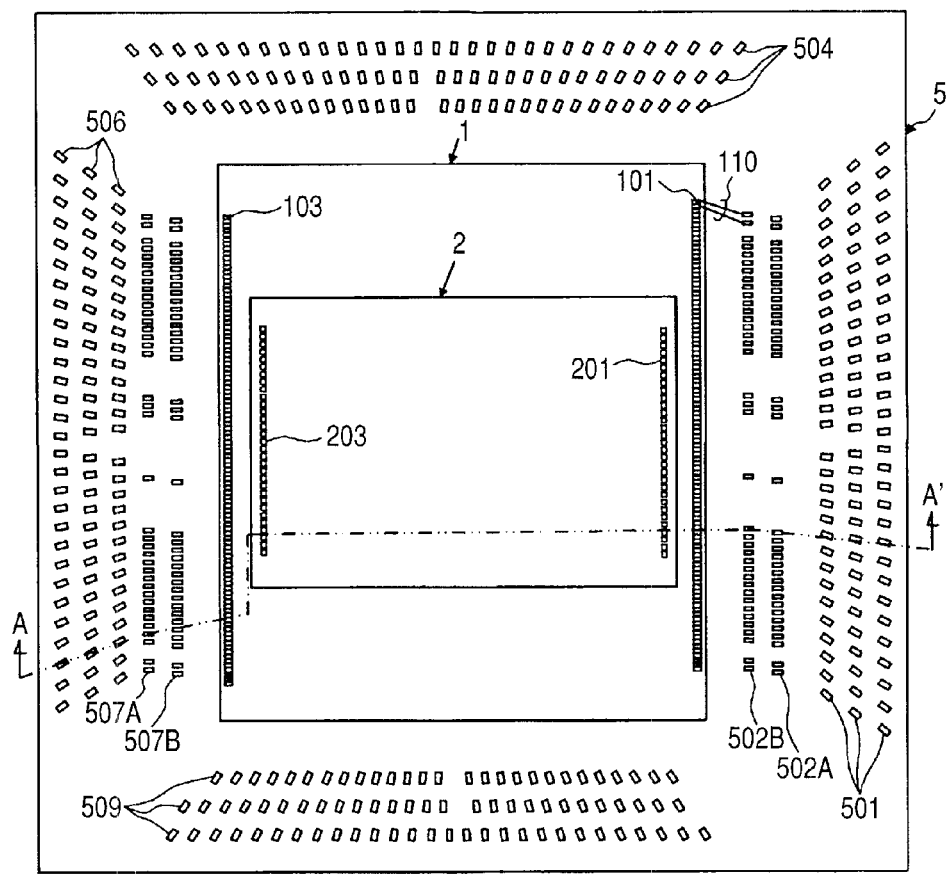
FIG. 9 is the schematic plan view which mounted the flash memory chip on the SDRM chip.
Figure 10:
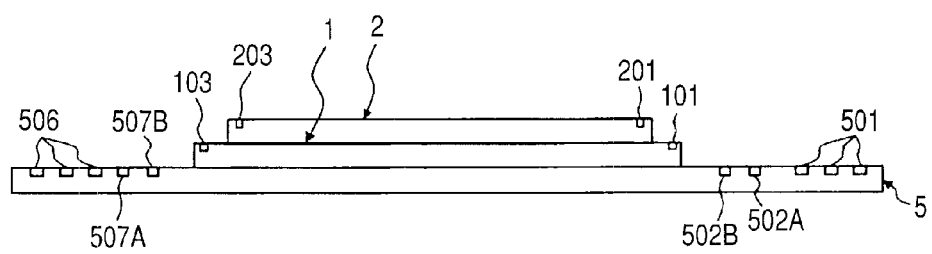
FIG. 10 is a schematic cross-sectional view which goes along the A-A' line of FIG. 9.

Next, at Step S2, as shown in FIG. 7 and FIG. 8, SDRAM chip 1 is mounted via adhesion paste (not shown) on the front surface of module substrate 5 (chip die bond). The central line of a module substrate is adjusted with the central line of SDRAM chip 1 at the time of mounting. At the following step S3, as shown in FIG. 9 and FIG. 10, flash memory chip 2 is mounted via adhesion paste (not shown) on SDRAM chip 1. What is necessary is just to laminate them making the central line of each semiconductor chip 1 and 2 as a mark of alignment, at the time of mounting, so that the central line of semiconductor chip 2 at the side of the upper row may overlap with the central line of semiconductor chip 1 at the side of a lower row. The overflowing adhesion paste is removed at Step S4 (die bond material cure).

Figure 11:
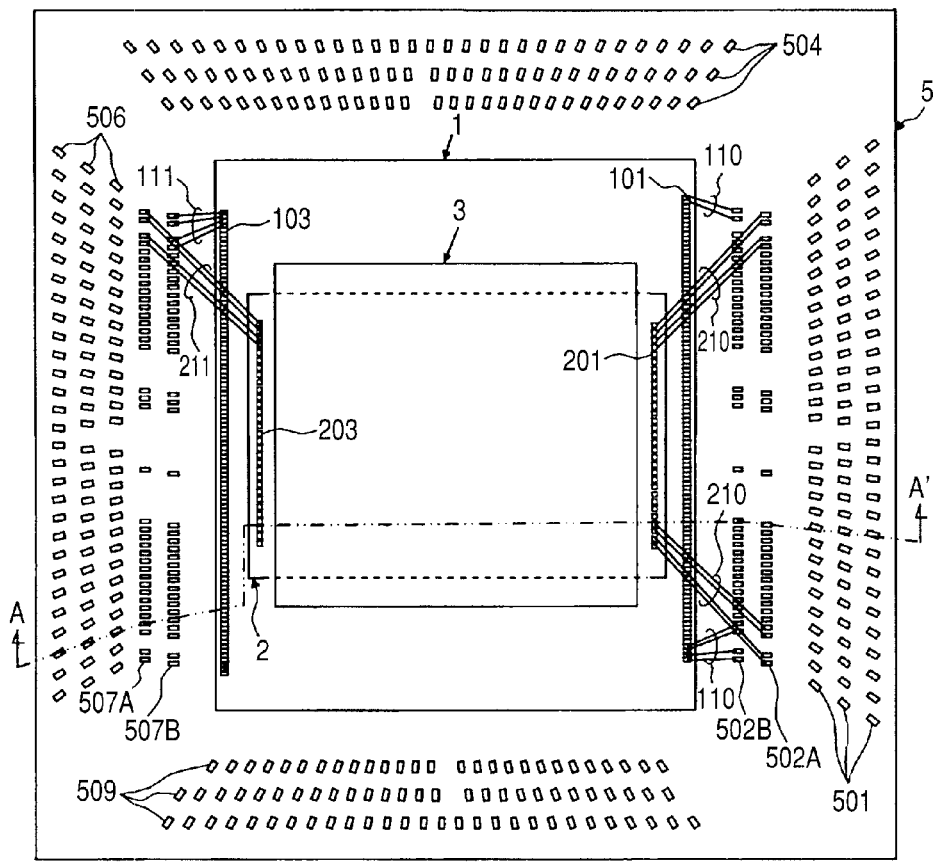
FIG. 11 is the schematic plan view which mounted the spacer on the SDRAM chip and did wire bonding of each of a SDRAM chip and a flash memory chip, and the module substrate.
Figure 12:
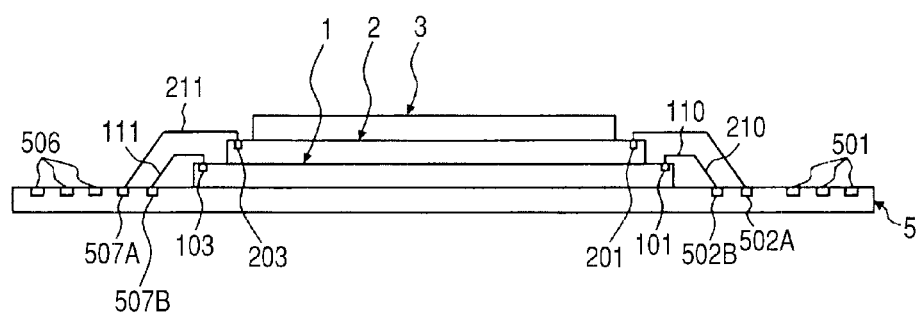
FIG. 12 is a schematic cross-sectional view which goes along the A-A' line of FIG. 11.

Then, as shown in FIG. 11 and FIG. 12, at Step S5, spacer 3 is mounted via an adhesive film (not shown) on the front surface of flash memory chip 2 (spacer die bond). At the time of mounting, the central line of flash memory chip 2 is adjusted with the central line of spacer 3. At the following step S6, on the whole, plasma treatment is performed for module substrate 5 which mounted chips 1 and 2 and spacer 3, and the front surface of each bonding lead and electrode pad is cleaned. Then, a plurality of bonding leads 502B and 507B of module substrate 5 are electrically connected with a plurality of electrode pads 101 and 103 of SDRAM chip 1 via a plurality of bonding wires 110 and 111 which consist of a conductive member, respectively (S7). Then, a plurality of bonding leads 502A and 507A of module substrate 5 are electrically connected with a plurality of electrode pads 201 and 203 of flash memory chip 2, respectively by a plurality of bonding wires 210 and 211 which consist of a conductive member (S8). After doing wire bonding of the flash memory chip 2 of the upper row previously, when wire bonding of SDRAM chip 1 of a lower row is performed, the wire formed previously and the tip of a capillary which is a wire-bonding tool contact, and there is a possibility of causing a disconnection failure. Wire bonding of the semiconductor chip 1 of a lower row can be done first, and contact of a wire and a capillary can be suppressed by performing wire bonding of semiconductor chip 2 at the side of the upper row, and module substrate 3 after that. This is because the loop shape of the wire formed later is located up rather than the loop shape of the wire formed previously.

Figure 13:
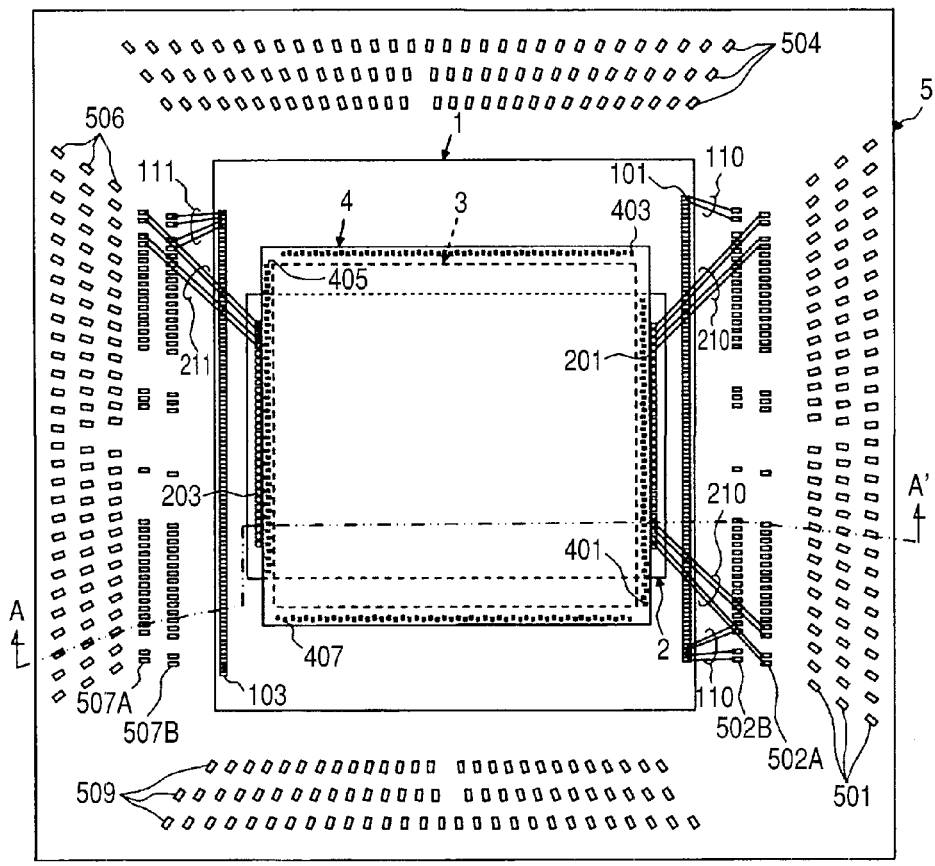
FIG. 13 is a schematic plan view which mounts a microcomputer chip on a spacer.
Figure 14:
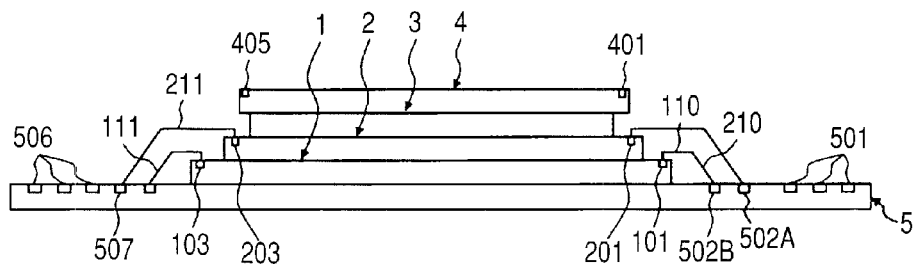
FIG. 14 is a schematic cross-sectional view which goes along the A-A' line of FIG. 13.
Figure 15:
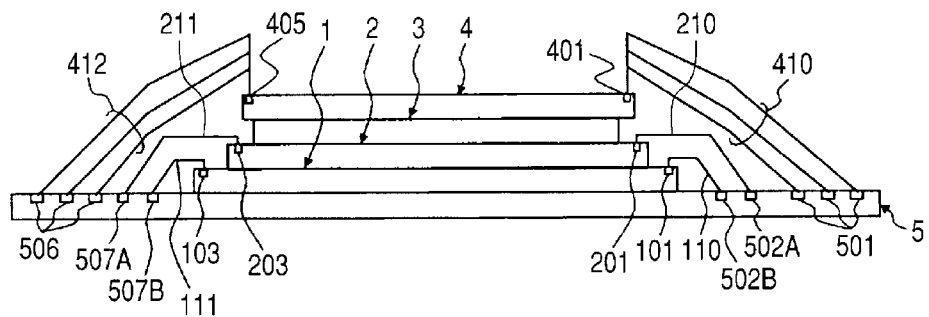
FIG. 15 is the schematic cross-sectional view which did wire bonding of a microcomputer chip and the module substrate.
Figure 16:
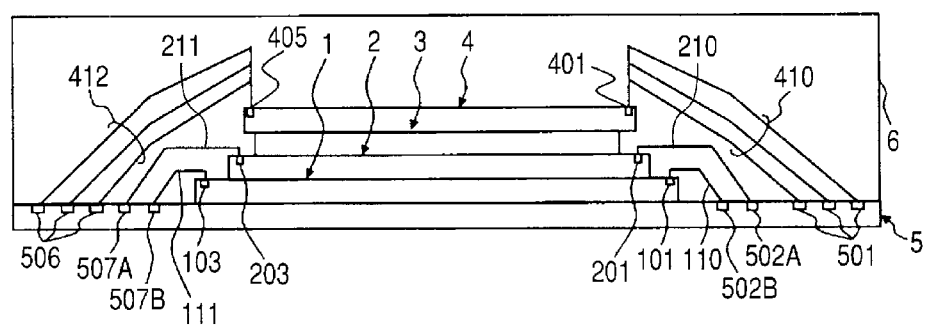
FIG. 16 is a schematic cross-sectional view in which the sealing body was formed on the module substrate.

Next, as shown in FIG. 13 and FIG. 14, at Step S9, microcomputer chip 4 is mounted via an adhesive film (not shown) on the front surface of spacer 3 (chip die bond). The central line of microcomputer chip 4 is adjusted with the central line of spacer 3 at the time of mounting. As exemplified by FIG. 15 at the following step S10, a plurality of electrode pads 401, 403, 405, and 407 of microcomputer chip 4, and a plurality of bonding leads 501, 504, 506, and 509 of module substrate 5 are electrically connected via a plurality of bonding wires 410, 411, 412, and 413 which consist of a conductive member, respectively. Then, on the whole, plasma treatment is performed and the adhesion with sealing resin in a next molding step is improved (SU). As shown in FIG. 16, next, the front surface of module substrate 5, SDRAM chip 1, flash memory chip 2, spacer 3, microcomputer chip 4, and all the bonding wires 110, 210, 410, 411, 111, 211, 412, and 413 are sealed with sealing resin 6, and a sealing body is formed (S12). Here, a batch molding method is adopted as a molding step. Finally many ball electrodes 511 are formed in the back surface side of module substrate 5 (S13). In an individual separation step, a dicing blade cuts and separates a plurality of product formation areas, and a plurality of semiconductor devices MDL are obtained (S14). The end portion of the sealing body of semiconductor device MDL is formed in the same position as the end portion of module substrate 5.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

For example, the first through a third semiconductor chip are not limited to a microcomputer chip, a flash memory chip, and a SDRAM chip, but can be changed suitably. In the internal circuit of a semiconductor chip, the circuit configuration should just be determined according to the function of the semiconductor chip concerned. A resin seal may not be limited to a batch molding method, but may be an individual mold method. The semiconductor chips by which a stack is done may be two stages of two chips which were not limited to three stages but sandwiched the spacer, and may be four or more stages. The semiconductor chips by which a stack is done may be any of a custom-made article and a general-purpose article, and may be combined suitably.

What is claimed is:

1. A semiconductor device, comprising:
   a wiring substrate having an upper surface, a plurality of first bonding leads formed on the upper surface, a plurality of second bonding leads formed on the upper surface, and a lower surface opposed to the upper surface;
   a first semiconductor chip having a first main surface, a plurality of first electrode pads formed on the first main surface, and a first back surface opposed to the first main surface, and mounted over the upper surface of the wiring substrate such that the first back surface faces to the upper surface of the wiring substrate;
   a spacer having a front surface, and a rear surface opposed to the front surface, and mounted over the first main surface of the first semiconductor chip such that the rear surface faces to the first main surface of the first semiconductor chip;
   a second semiconductor chip having a second main surface, a plurality of second electrode pads formed on the second main surface, and a second back surface opposed to the second main surface, and mounted over the front surface of the spacer such that the second back surface faces to the front surface of the spacer;
   a plurality of first bonding wires electrically connected the plurality of first bonding leads with the plurality of first electrode pads, respectively; and
   a plurality of second bonding wires electrically connected the plurality of second bonding leads with the plurality of second electrode pads, respectively;
   wherein a planar shape of the wiring substrate is a rectangle including pair of first sides, and pair of second sides intersecting with the first side;
   wherein the plurality of first bonding leads are formed along the first side;

wherein the plurality of second bonding leads are formed along the second side;

wherein a planar shape of the first semiconductor chip is a rectangle including pair of third sides, and pair of fourth sides intersecting with the third side;

wherein the plurality of first electrode pads are formed along the third side, and are not formed along the fourth side;

wherein the first semiconductor chip is mounted over the upper surface of the wiring substrate such that the third side is arranged next to the first side of the wiring substrate in a plan view;

wherein a planar shape of the spacer is a rectangle including pair of fifth sides, and pair of sixth sides intersecting with the fifth side;

wherein the spacer is mounted over the first main surface of the first semiconductor chip such that the fifth side is arranged next to the first side of the wiring substrate in a plan view, the plurality of first electrode pads are exposed from the spacer, the fifth side is arranged inside of the third side of the first semiconductor chip in a plan view, and the sixth side is arranged outside of the fourth side of the first semiconductor chip; in a plan view;

wherein a part of the fourth side of the first semiconductor chip is covered with the spacer in a plan view;

wherein a planar shape of the second semiconductor chip is a rectangle including pair of seventh sides, and pair of eighth sides intersecting with the seventh side;

wherein the plurality of second electrode pads are formed along the eighth side;

wherein the second semiconductor chip is mounted over the front surface of the spacer such that the seventh side is arranged next to the first side of the wiring substrate in a plan view, the seventh side is arranged inside of the third side of the first semiconductor chip in a plan view, and the eighth side is arranged outside of the sixth side of the spacer in a plan view; and wherein the sixth side of the spacer is covered with the second semiconductor chip in a plan view.

2. A semiconductor device according to claim 1, wherein a value, which is divided a protruded length (B) of the eighth side of the second semiconductor chip from the sixth side of the spacer by a thickness (A) of the second semiconductor chip, is less than or equal to 10.

3. A semiconductor device according to claim 2, wherein the plurality of second electrode pads are formed along each of the seventh and eighth sides in the second main surface of the second semiconductor chip.

4. A semiconductor device according to claim 3, wherein the first semiconductor chip, the spacer and the second semiconductor chip are sealed with a sealing resin; and wherein a plurality of ball electrodes are formed on the lower surface of the wiring substrate.

5. A semiconductor device, comprising:

a wiring substrate having an upper surface, a plurality of first bonding leads formed on the upper surface, a plurality of second bonding leads formed on the upper surface, and a lower surface opposed to the upper surface;

a first semiconductor chip having a first main surface, a plurality of first electrode pads formed on the first main surface, and a first back surface opposed to the first main surface, and mounted over the upper surface of the wiring substrate such that the first back surface faces to the upper surface of the wiring substrate;

a spacer having a front surface, and a rear surface opposed to the front surface, and mounted over the first main surface of the first semiconductor chip such that the rear surface faces to the first main surface of the first semiconductor chip;

a second semiconductor chip having a second main surface, a plurality of second electrode pads formed on the second main surface, and a second back surface opposed to the second main surface, and mounted over the front surface of the spacer such that the second back surface faces to the front surface of the spacer;

a plurality of first bonding wires electrically connected the plurality of first bonding leads with the plurality of first electrode pads, respectively; and a plurality of second bonding wires electrically connected the plurality of second bonding leads with the plurality of second electrode pads, respectively;

wherein a planar shape of the wiring substrate is a rectangle including pair of first sides, and pair of second sides intersecting with the first side;

wherein the plurality of first bonding leads are formed along the first side;

wherein the plurality of second bonding leads are formed along the second side;

wherein a planar shape of the first semiconductor chip is a rectangle including pair of third sides, and pair of fourth sides intersecting with the third side;

wherein the plurality of first electrode pads are formed along the third side, and are not formed along the fourth side;

wherein the first semiconductor chip is mounted over the upper surface of the wiring substrate such that the third side is arranged next to the first side of the wiring substrate in a plan view;

wherein a planar shape of the spacer is a rectangle including pair of fifth sides, and pair of sixth sides intersecting with the fifth side;

wherein the spacer is mounted over the first main surface of the first semiconductor chip such that the fifth side is arranged next to the first side of the wiring substrate in a plan view, the plurality of first electrode pads are exposed from the spacer, the fifth side is arranged inside of the third side of the first semiconductor chip in a plan view, and the sixth side is arranged outside of the fourth side of the first semiconductor chip; in a plan view;

wherein a part of the fourth side of the first semiconductor chip is covered with the spacer in a plan view;

wherein a planar shape of the second semiconductor chip is a rectangle including pair of seventh sides, and pair of eighth sides intersecting with the seventh side;

wherein the plurality of second electrode pads are formed along the eighth side;

wherein the second semiconductor chip is mounted over the front surface of the spacer such that the seventh side is arranged next to the first side of the wiring substrate in a plan view, the seventh side is arranged outside of the fifth side of the spacer in a plan view, and the eighth side is arranged outside of the sixth side of the spacer in a plan view; and wherein the sixth side of the spacer is covered with the second semiconductor chip in a plan view.

6. A semiconductor device according to claim 5, wherein a value, which is divided a protruded length (B) of the eighth side of the second semiconductor chip from the sixth side of the spacer by a thickness (A) of the second semiconductor chip, is less than or equal to 10.

7. A semiconductor device according to claim 6, wherein the plurality of second electrode pads are formed along each of the seventh and eighth sides in the second main surface of the second semiconductor chip.

8. A semiconductor device according to claim 7, wherein the first semiconductor chip, the spacer and the second semiconductor chip are sealed with a sealing resin; and
   wherein a plurality of ball electrodes are formed on the lower surface of the wiring substrate.

9. A semiconductor device, comprising:
   a wiring substrate having an upper surface, a plurality of first bonding leads formed on the upper surface, a plurality of second bonding leads formed on the upper surface, and a lower surface opposed to the upper surface;
   a first semiconductor chip having a first main surface, a plurality of first electrode pads formed on the first main surface, and a first back surface opposed to the first main surface, and mounted over the upper surface of the wiring substrate such that the first back surface faces to the upper surface of the wiring substrate;
   a spacer having a front surface, and a rear surface opposed to the front surface, and mounted over the first main surface of the first semiconductor chip such that the rear surface faces to the first main surface of the first semiconductor chip;
   a second semiconductor chip having a second main surface, a plurality of second electrode pads formed on the second main surface, and a second back surface opposed to the second main surface, and mounted over the front surface of the spacer such that the second back surface faces to the front surface of the spacer;
   a plurality of first bonding wires electrically connected the plurality of first bonding leads with the plurality of first electrode pads, respectively; and
   a plurality of second bonding wires electrically connected the plurality of second bonding leads with the plurality of second electrode pads, respectively;
   wherein a planar shape of the wiring substrate is a rectangle including pair of first sides, and pair of second sides intersecting with the first side;
   wherein the plurality of first bonding leads are formed along the first side;
   wherein the plurality of second bonding leads are formed along the second side;
   wherein a planar shape of the first semiconductor chip is a rectangle including pair of third sides, and pair of fourth sides intersecting with the third side;
   wherein the plurality of first electrode pads are formed along the third side, and are not formed along the fourth side;
   wherein the first semiconductor chip is mounted over the upper surface of the wiring substrate such that the third side is arranged next to the first side of the wiring substrate in a plan view;
   wherein a planar shape of the spacer is a rectangle including pair of fifth sides, and pair of sixth sides intersecting with the fifth side;
   wherein the spacer is mounted over the first main surface of the first semiconductor chip such that the fifth side is arranged next to the first side of the wiring substrate in a plan view, the plurality of first electrode pads are exposed from the spacer, the fifth side is arranged inside of the third side of the first semiconductor chip in a plan view, and the sixth side is arranged outside of the fourth side of the first semiconductor chip; in a plan view;
   wherein a part of the fourth side of the first semiconductor chip is covered with the spacer in a plan view;
   wherein a planar shape of the second semiconductor chip is a rectangle including pair of seventh sides, and pair of eighth sides intersecting with the seventh side;
   wherein the plurality of second electrode pads are formed along the eighth side;
   wherein the second semiconductor chip is mounted over the front surface of the spacer such that the seventh side is arranged next to the first side of the wiring substrate in a plan view, the seventh side is arranged between the third side of the first semiconductor chip and the fifth side of the spacer in a plan view, and the eighth side is arranged outside of the sixth side of the spacer in a plan view; and
   wherein the sixth side of the spacer is covered with the second semiconductor chip in a plan view.

10. A semiconductor device according to claim 9, wherein a value, which is divided a protruded length (B) of the eighth side of the second semiconductor chip from the sixth side of the spacer by a thickness (A) of the second semiconductor chip, is less than or equal to 10.

11. A semiconductor device according to claim 10, wherein the plurality of second electrode pads are formed along each of the seventh and eighth sides in the second main surface of the second semiconductor chip.

12. A semiconductor device according to claim 11, wherein the first semiconductor chip, the spacer and the second semiconductor chip are sealed with a sealing resin; and
   wherein a plurality of ball electrodes are formed on the lower surface of the wiring substrate.

* * * * *